(12) United States Patent
Goudarzi et al.

(10) Patent No.: US 11,489,942 B2
(45) Date of Patent: *Nov. 1, 2022

(54) TIME SERIES DATA ANALYSIS

(71) Applicant: SERVICENOW, INC., Santa Clara, CA (US)

(72) Inventors: Khashayar Goudarzi, Mukilteo, WA (US); Vinayak Raju Kuraku, Hyderabad (IN); Sharath Vaddempudi, Kirkland, WA (US)

(73) Assignee: ServiceNow, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/446,032

(22) Filed: Aug. 26, 2021

(65) Prior Publication Data
US 2021/0392199 A1 Dec. 16, 2021

Related U.S. Application Data

(63) Continuation of application No. 16/670,630, filed on Oct. 31, 2019, now Pat. No. 11,122,145.

(51) Int. Cl.
*H04L 67/60* (2022.01)
*H04L 41/16* (2022.01)
(Continued)

(52) U.S. Cl.
CPC .......... *H04L 67/60* (2022.05); *G06F 11/3447* (2013.01); *G06F 30/27* (2020.01);
(Continued)

(58) Field of Classification Search
CPC ....... H04L 67/60; H04L 41/142; H04L 41/16; H04L 41/5061; H04L 41/145;
(Continued)

(56) References Cited

U.S. PATENT DOCUMENTS 6,609,127 B1 8/2003 Ensor
7,020,706 B2 3/2006 Cates
(Continued)

OTHER PUBLICATIONS

Frank et al. The WEKA Workbench. Online Appendix for "Data Mining: Practical Machine Learning Tools and Techniques", 2016, Morgan Kaufmann, Fourth Edition, p. 1-128 (Year: 2016).*

(Continued)

*Primary Examiner* — Tonia L Dollinger
*Assistant Examiner* — Joseph M Cousins
(74) *Attorney, Agent, or Firm* — Fletcher Yoder PC

(57) ABSTRACT

The present approach relates to the use of time series analyses to estimate times or time intervals when a user of IT resources is likely to schedule or request that an operation is run on those services. In certain implementations, the present approach performs forecasting using time series data and supervised machine learning techniques. These techniques may be used to help predict future times when an operation or operations may be requested for execution. Based on these predicted future time, automations (e.g., the automated execution of operations) may be scheduled so as to effectively utilize available resources and efficiently perform the operations.

20 Claims, 9 Drawing Sheets

(51) Int. Cl.
   *G06F 11/34*    (2006.01)
   *H04L 41/142*   (2022.01)
   *H04L 41/5061*  (2022.01)
   *G06F 30/27*    (2020.01)

(52) U.S. Cl.
   CPC ............ *H04L 41/142* (2013.01); *H04L 41/16* (2013.01); *H04L 41/5061* (2013.01)

(58) Field of Classification Search
   CPC ..... H04L 41/149; H04L 41/40; H04L 41/147; G06F 11/3447; G06F 30/27
   See application file for complete search history.

(56) References Cited

U.S. PATENT DOCUMENTS

| | | |
|---|---|---|
| 7,028,301 B2 | 4/2006 | Ding |
| 7,062,683 B2 | 6/2006 | Warpenburg |
| 7,131,037 B1 | 10/2006 | LeFaive |
| 7,170,864 B2 | 1/2007 | Matharu |
| 7,350,209 B2 | 3/2008 | Shum |
| 7,610,512 B2 | 10/2009 | Gerber |
| 7,617,073 B2 | 11/2009 | Trinon |
| 7,689,628 B2 | 3/2010 | Garg |
| 7,716,353 B2 | 5/2010 | Golovinsky |
| 7,769,718 B2 | 8/2010 | Murley |
| 7,783,744 B2 | 8/2010 | Garg |
| 7,890,802 B2 | 2/2011 | Gerber |
| 7,925,981 B2 | 4/2011 | Pourdeidari |
| 7,930,396 B2 | 4/2011 | Trinon |
| 7,945,860 B2 | 5/2011 | Vambenepe |
| 7,966,398 B2 | 6/2011 | Wiles |
| 8,051,164 B2 | 11/2011 | Peuter |
| 8,224,683 B2 | 7/2012 | Manos |
| 8,266,096 B2 | 9/2012 | Navarrete |
| 8,402,127 B2 | 3/2013 | Solin |
| 8,457,928 B2 | 6/2013 | Dang |
| 8,478,569 B2 | 7/2013 | Scarpelli |
| 8,612,408 B2 | 12/2013 | Trinon |
| 8,674,992 B2 | 3/2014 | Poston |
| 8,689,241 B2 | 4/2014 | Naik |
| 8,743,121 B2 | 6/2014 | De Peuter |
| 8,832,652 B2 | 9/2014 | Mueller |
| 8,887,133 B2 | 11/2014 | Behnia |
| 9,098,322 B2 | 8/2015 | Apte |
| 9,239,857 B2 | 1/2016 | Trinon |
| 9,317,327 B2 | 4/2016 | Apte |
| 9,363,252 B2 | 6/2016 | Mueller |
| 9,535,737 B2 | 1/2017 | Joy |
| 9,645,833 B2 | 5/2017 | Mieller |
| 9,654,473 B2 | 5/2017 | Miller |
| 9,766,935 B2 | 9/2017 | Kelkar |
| 9,792,387 B2 | 10/2017 | George |
| 9,805,322 B2 | 10/2017 | Kelkar |
| 2012/0284213 A1 | 11/2012 | Lin et al. |
| 2017/0243132 A1 | 8/2017 | Sainani et al. |
| 2018/0287956 A1 | 10/2018 | Bryc et al. |
| 2019/0150164 A1 | 5/2019 | Nam et al. |
| 2019/0204131 A1 | 7/2019 | Jablokov et al. |
| 2020/0150979 A1 | 5/2020 | Goudarzi et al. |
| 2020/0250000 A1 | 8/2020 | Vaddempudi et al. |
| 2020/0257968 A1* | 8/2020 | Mitra .................. G06F 9/4881 |
| 2021/0064420 A1 | 3/2021 | Goudarzi et al. |

OTHER PUBLICATIONS

Frank et al.; The WEKA Workbench. Online Appendix for "Data Mining: Practical Machine Learning Tools and Techniques", 106, Morgan Kaufmann, Fourth Edition, p. 1-128 (Year: 2016).

* cited by examiner

TIME SERIES DATA ANALYSIS

CROSS REFERENCE TO RELATED APPLICATIONS

This application is a continuation of U.S. application Ser. No. 16/670,630, entitled "TIME SERIES DATA ANALYSIS," filed Oct. 31, 2019, which is hereby incorporated by reference in its entirety for all purposes.

BACKGROUND

The present disclosure relates generally to time series data analysis in the context of providing or planning information technology (IT) services or operations.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Organizations, regardless of size, rely upon access to information technology (IT) and data and services for their continued operation and success. A respective organization's IT infrastructure may have associated hardware resources (e.g. computing devices, load balancers, firewalls, switches, etc.) and software resources (e.g. productivity software, database applications, custom applications, and so forth). Over time, more and more organizations have turned to cloud computing approaches to supplement or enhance their IT infrastructure solutions.

Cloud computing relates to the sharing of computing resources that are generally accessed via the Internet. In particular, a cloud computing infrastructure allows users, such as individuals and/or enterprises, to access a shared pool of computing resources, such as servers, storage devices, networks, applications, and/or other computing based services. By doing so, users are able to access computing resources on demand that are located at remote locations, which resources may be used to perform a variety of computing functions (e.g., storing and/or processing large quantities of computing data). For enterprise and other organization users, cloud computing provides flexibility in accessing cloud computing resources without accruing large up-front costs, such as purchasing expensive network equipment or investing large amounts of time in establishing a private network infrastructure. Instead, by utilizing cloud computing resources, users are able redirect their resources to focus on their enterprise's core functions.

One issue that can arise in contexts of managing such IT infrastructures is that numerous administrative (or other) operations may need to be performed on a recurring basis as well as on-demand. As a result, it may be difficult to schedule such operations or accommodate the need to run an operation that was not previously scheduled. Further, optimization and/or management of system resources may be impacted by the need to accommodate operations run to support such an IT infrastructure.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

The present approach relates to the use of time series analyses to estimate times or time intervals when a user of IT resources (e.g., a customer of infrastructure as a service (IaaS), software as a service (SaaS), or platform as a service (PaaS) technologies) is likely to schedule or request that an operation is run on those services. Such automations may include, but are not limited to, clone automations performed on a given source and target instance, move, backup, restore, or rename, operations for a cloud-based instance or instances, and other cloud operations performed as part of change management processes implemented to support the cloud instances for a customer. In certain implementations, the present approach performs forecasting using time series data and supervised machine learning techniques. These techniques may be used to help predict future times when an operation or operations may be requested for execution. Based on these predicted future time, automations (e.g., the automated execution of operations) may be scheduled so as to effectively utilize available resources and efficiently perform the operations.

Various refinements of the features noted above may exist in relation to various aspects of the present disclosure. Further features may also be incorporated in these various aspects as well. These refinements and additional features may exist individually or in any combination. For instance, various features discussed below in relation to one or more of the illustrated embodiments may be incorporated into any of the above-described aspects of the present disclosure alone or in any combination. The brief summary presented above is intended only to familiarize the reader with certain aspects and contexts of embodiments of the present disclosure without limitation to the claimed subject matter.

BRIEF DESCRIPTION OF THE DRAWINGS

Various aspects of this disclosure may be better understood upon reading the following detailed description and upon reference to the drawings in which.

DETAILED DESCRIPTION

Figure 1:
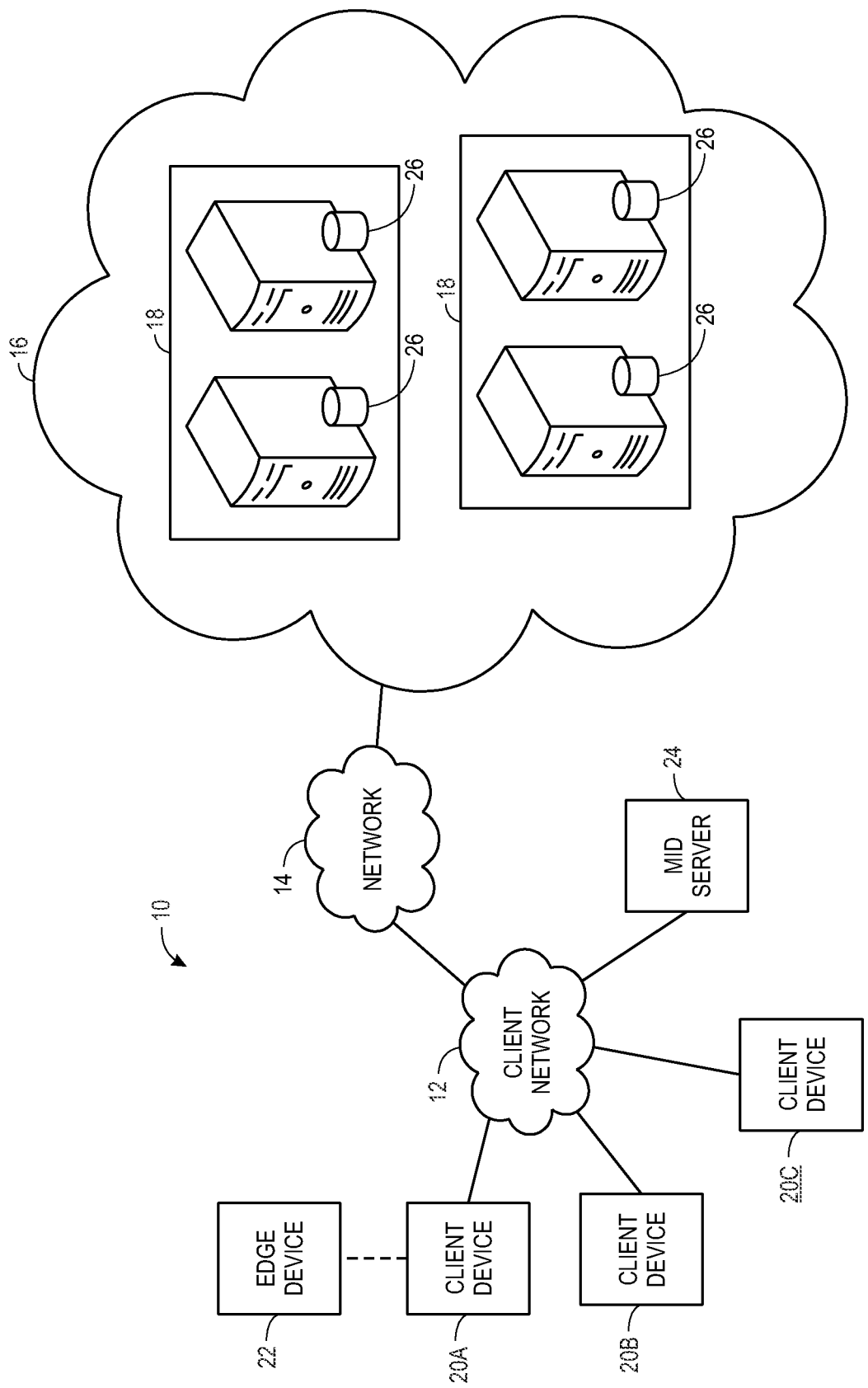
FIG. 1 is a block diagram of an embodiment of a cloud architecture in which embodiments of the present disclosure may operate.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and enterprise-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

As used herein, the term "computing system" or "computing device" refers to an electronic computing device such as, but not limited to, a single computer, virtual machine, virtual container, host, server, laptop, and/or mobile device, or to a plurality of electronic computing devices working together to perform the function described as being performed on or by the computing system. As used herein, the term "machine-readable medium" may include a single medium or multiple media (e.g., a centralized or distributed database, and/or associated caches and servers) that store one or more instructions or data structures. The term "non-transitory machine-readable medium" shall also be taken to include any tangible medium that is capable of storing, encoding, or carrying instructions for execution by the computing system and that cause the computing system to perform any one or more of the methodologies of the present subject matter, or that is capable of storing, encoding, or carrying data structures utilized by or associated with such instructions. The term "non-transitory machine-readable medium" shall accordingly be taken to include, but not be limited to, solid-state memories, and optical and magnetic media. Specific examples of non-transitory machine-readable media include, but are not limited to, non-volatile memory, including by way of example, semiconductor memory devices (e.g., Erasable Programmable Read-Only Memory (EPROM), Electrically Erasable Programmable Read-Only Memory (EEPROM), and flash memory devices), magnetic disks such as internal hard disks and removable disks, magneto-optical disks, and CD-ROM and DVD-ROM disks.

As used herein, the terms "application," "engine," and "plug-in" refer to one or more sets of computer software instructions (e.g., computer programs and/or scripts) executable by one or more processors of a computing system to provide particular functionality. Computer software instructions can be written in any suitable programming languages, such as C, C++, C#, Pascal, Fortran, Perl, MATLAB, SAS, SPSS, JavaScript, AJAX, and JAVA. Such computer software instructions can comprise an independent application with data input and data display modules. Alternatively, the disclosed computer software instructions can be classes that are instantiated as distributed objects. The disclosed computer software instructions can also be component software. Additionally, the disclosed applications or engines can be implemented in computer software, computer hardware, or a combination thereof. As used herein, the term "framework" refers to a system of applications and/or engines, as well as any other supporting data structures, libraries, modules, and any other supporting functionality, that cooperate to perform one or more overall functions.

In addition, as used herein, the term "time series" or "time series data" means that the referenced data is in a series of particular time periods or intervals. Correspondingly, "time series analysis" is a statistical technique (or techniques) that deals with time series data or trend analysis, such as discerning trends over time. With regard to further terminology that may be employed herein, the terms "window lag", "sliding window", or "window" method may generally be understood to refer to the use of prior time steps to predict the next time step. A "cluster" is a group that represents the data uniformly. A "cluster class" is a range defined with minimum and maximum values. As used herein, there is a uniformity and equal priority defined for every value within a given cluster. For example, cluster class may be defined as 10-20. Within this cluster class, all the values from 10-20 are assigned with equal priority. That is a datapoint or observation of 10 has equal value to a datapoint or observation of 11. As used herein, a "linear regression" may be implemented as a supervised machine learning routine. When a data set is used to train such a linear regression model, the model may be used to fit the best line to predict the value of y for a given value of x. As used here, the term "random forest" may be understood to refer to an ensemble machine learning routine or approach for classification and regression. Such an approach may operate by constructing multiple decision tress at training time and by outputting the class and/or mean of the individual decision trees. A "root mean squared error" or "RMSE" as used herein refers to a quadratic scoring rule that also measures the average magnitude of the error. It may be understood to be the square root of the average of squared differences between prediction and actual observation. A "mean absolute error" or "MAE" as used herein measures the average magnitude of the errors in a set of predictions, without considering their direction. It may be understood to be the average over the test sample of the absolute differences between prediction and actual observation where all individual differences have equal weight. A "measure" as used herein refers to a standard unit used to express the size, amount, or degree of a measured parameter or value.

As discussed herein, approaches are described to help facilitate the scheduling and implementation of scheduled operations (e.g., automations) in support of an IT infrastructure, such as an environment in which one or more client instances are maintained and/or supported for an organization. In accordance with certain implementations, time series analyses may be used to estimate times or time intervals when a user of IT resources (e.g., a customer of infrastructure as a service (IaaS), software as a service (SaaS), or platform as a service (PaaS) technologies) is likely to schedule or request that an operation is run on those services. In certain implementations, the present approach performs forecasting with respect to a given operation or operations using time series data and supervised machine learning techniques to help identify a suitable time series analytic model for predicting future scheduling requests for the respective operation(s). These techniques may be used to help predict future times when an operation or operations may be requested for execution. Based on these predicted future time, automations (e.g., the automated execution of operations) may be scheduled so as to effectively utilize available resources and efficiently perform the operations.

By way of providing real-world examples where the present approaches may be beneficial, in a first example customer may regularly schedule clone automation on given source and target instances. Certain of the customers may schedule their clone automations to run in accordance with some regular pattern of time intervals. If the date and time of such regular automations can be predicted for these customers, an entity administering the IT infrastructure (e.g., an IT or cloud service provider) can reduce the time taken for the respective clone processes (from hours to minutes) and improve the overall experience for the customer.

In a further example, such an IT or cloud service provider may employ scheduling time conflict detection (STCD) to determine if two or more operations being requested or scheduled can run in parallel. For example, an instance A may be scheduled for a Move Operation at time $t_0$ and another automation, such as a Clone operation, may be in the process of being scheduled at $t_1$ on the same instance A. The second operation may be scheduled if either the two operations (e.g., Move and Clone) are mutually exclusive or if $t_0$ and $t_1$ are not intersecting (i.e., overlapping) with each other. By predicting the date and time of the next operation for a given instance in accordance with the present approaches, some portion of the logic employed in support of such as STCD application programming interface (API) may be skipped, reduced, or simplified.

In yet another example, in certain contexts or infrastructures every cloud operation performed on an instance is performed via a change management system or framework. Such a change management system may benefit from being able to determine the date and time of a given set of operations for a given instance(s) in accordance with the presently disclosed prediction approaches.

With the preceding in mind, the following figures relate to various types of generalized system architectures or configurations that may be employed to provide services to an organization in a multi-instance framework and on which the present approaches may be employed. Correspondingly, these system and platform examples may also relate to systems and platforms on which the techniques discussed herein may be implemented or otherwise utilized. Turning now to FIG. 1, a schematic diagram of an embodiment of a cloud computing system 10 where embodiments of the present disclosure may operate, is illustrated. The cloud computing system 10 may include a client network 12, a network 14 (e.g., the Internet), and a cloud-based platform 16. In some implementations, the cloud-based platform 16 may be a configuration management database (CMDB) platform. In one embodiment, the client network 12 may be a local private network, such as local area network (LAN) having a variety of network devices that include, but are not limited to, switches, servers, and routers. In another embodiment, the client network 12 represents an enterprise network that could include one or more LANs, virtual networks, data centers 18, and/or other remote networks. As shown in FIG. 1, the client network 12 is able to connect to one or more client devices 20A, 20B, and 20C so that the client devices are able to communicate with each other and/or with the network hosting the platform 16. The client devices 20 may be computing systems and/or other types of computing devices generally referred to as Internet of Things (IoT) devices that access cloud computing services, for example, via a web browser application or via an edge device 22 that may act as a gateway between the client devices 20 and the platform 16. FIG. 1 also illustrates that the client network 12 includes an administration or managerial device, agent, or server, such as a management, instrumentation, and discovery (MID) server 24 that facilitates communication of data between the network hosting the platform 16, other external applications, data sources, and services, and the client network 12. Although not specifically illustrated in FIG. 1, the client network 12 may also include a connecting network device (e.g., a gateway or router) or a combination of devices that implement a customer firewall or intrusion protection system.

For the illustrated embodiment, FIG. 1 illustrates that client network 12 is coupled to a network 14. The network 14 may include one or more computing networks, such as other LANs, wide area networks (WAN), the Internet, and/or other remote networks, to transfer data between the client devices 20 and the network hosting the platform 16. Each of the computing networks within network 14 may contain wired and/or wireless programmable devices that operate in the electrical and/or optical domain. For example, network 14 may include wireless networks, such as cellular networks (e.g., Global System for Mobile Communications (GSM) based cellular network), IEEE 802.11 networks, and/or other suitable radio-based networks. The network 14 may also employ any number of network communication protocols, such as Transmission Control Protocol (TCP) and Internet Protocol (IP). Although not explicitly shown in FIG. 1, network 14 may include a variety of network devices, such as servers, routers, network switches, and/or other network hardware devices configured to transport data over the network 14.

In FIG. 1, the network hosting the platform 16 may be a remote network (e.g., a cloud network) that is able to communicate with the client devices 20 via the client network 12 and network 14. The network hosting the platform 16 provides additional computing resources to the client devices 20 and/or the client network 12. For example, by utilizing the network hosting the platform 16, users of the client devices 20 are able to build and execute applications for various enterprise, IT, and/or other organization-related functions. In one embodiment, the network hosting the platform 16 is implemented on the one or more data centers 18, where each data center could correspond to a different geographic location. Each of the data centers 18 includes a plurality of virtual servers 26 (also referred to herein as application nodes, application servers, virtual server instances, application instances, or application server instances), where each virtual server 26 can be implemented on a physical computing system, such as a single electronic computing device (e.g., a single physical hardware server) or across multiple-computing devices (e.g., multiple physical hardware servers). Examples of virtual servers 26 include, but are not limited to a web server (e.g., a unitary Apache installation), an application server (e.g., unitary JAVA Virtual Machine), and/or a database server (e.g., a unitary relational database management system (RDBMS) catalog).

To utilize computing resources within the platform 16, network operators may choose to configure the data centers 18 using a variety of computing infrastructures. In one embodiment, one or more of the data centers 18 are configured using a multi-tenant cloud architecture, such that one of the server instances 26 handles requests from and serves multiple customers. Data centers 18 with multi-tenant cloud architecture commingle and store data from multiple customers, where multiple customer instances are assigned to one of the virtual servers 26. In a multi-tenant cloud architecture, the particular virtual server 26 distinguishes between and segregates data and other information of the various customers. For example, a multi-tenant cloud architecture could assign a particular identifier for each customer in order to identify and segregate the data from each customer. Generally, implementing a multi-tenant cloud architecture may suffer from various drawbacks, such as a failure of a particular one of the server instances 26 causing outages for all customers allocated to the particular server instance.

In another embodiment, one or more of the data centers 18 are configured using a multi-instance cloud architecture to provide every customer its own unique customer instance or instances. For example, a multi-instance cloud architecture could provide each customer instance with its own dedicated application server(s) and dedicated database server(s). In other examples, the multi-instance cloud architecture could deploy a single physical or virtual server 26 and/or other combinations of physical and/or virtual servers 26, such as one or more dedicated web servers, one or more dedicated application servers, and one or more database servers, for each customer instance. In a multi-instance cloud architecture, multiple customer instances could be installed on one or more respective hardware servers, where each customer instance is allocated certain portions of the physical server resources, such as computing memory, storage, and processing power. By doing so, each customer instance has its own unique software stack that provides the benefit of data isolation, relatively less downtime for customers to access the platform 16, and customer-driven upgrade schedules. An example of implementing a customer instance within a multi-instance cloud architecture will be discussed in more detail below with reference to FIG. 2.

Figure 2:
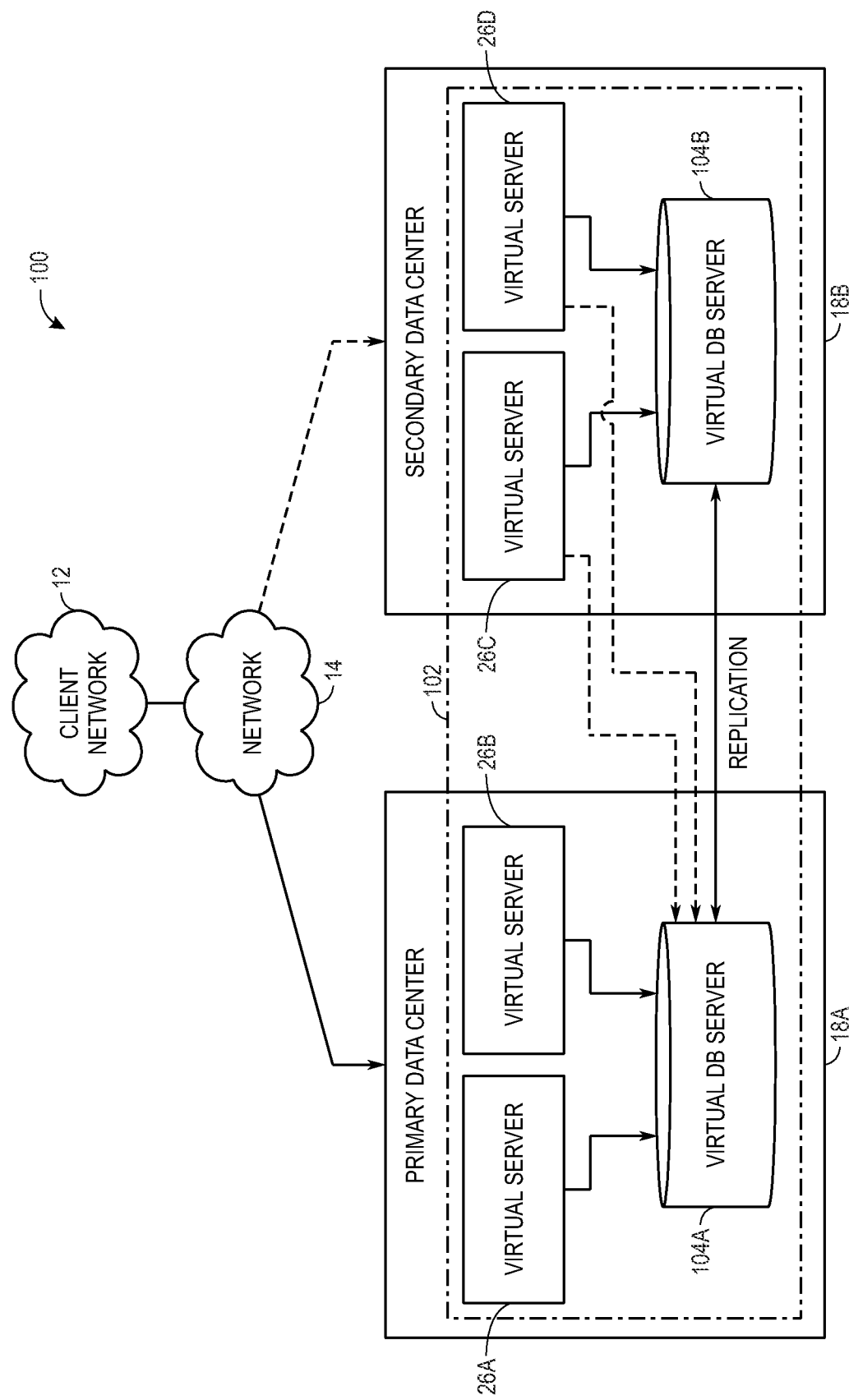
FIG. 2 is a schematic diagram of an embodiment of a multi-instance cloud architecture in which embodiments of the present disclosure may operate.

FIG. 2 is a schematic diagram of an embodiment of a multi-instance cloud architecture 100 where embodiments of the present disclosure may operate. FIG. 2 illustrates that the multi-instance cloud architecture 100 includes the client network 12 and the network 14 that connect to two (e.g., paired) data centers 18A and 18B that may be geographically separated from one another and provide data replication and/or failover capabilities. Using FIG. 2 as an example, network environment and service provider cloud infrastructure client instance 102 (also referred to herein as a client instance 102) is associated with (e.g., supported and enabled by) dedicated virtual servers (e.g., virtual servers 26A, 26B, 26C, and 26D) and dedicated database servers (e.g., virtual database servers 104A and 104B). Stated another way, the virtual servers 26A-26D and virtual database servers 104A and 104B are not shared with other client instances and are specific to the respective client instance 102. In the depicted example, to facilitate availability of the client instance 102, the virtual servers 26A-26D and virtual database servers 104A and 104B are allocated to two different data centers 18A and 18B so that one of the data centers 18 acts as a backup data center. Other embodiments of the multi-instance cloud architecture 100 could include other types of dedicated virtual servers, such as a web server. For example, the client instance 102 could be associated with (e.g., supported and enabled by) the dedicated virtual servers 26A-26D, dedicated virtual database servers 104A and 104B, and additional dedicated virtual web servers (not shown in FIG. 2).

Although FIGS. 1 and 2 illustrate specific embodiments of a cloud computing system 10 and a multi-instance cloud architecture 100, respectively, the disclosure is not limited to the specific embodiments illustrated in FIGS. 1 and 2. For instance, although FIG. 1 illustrates that the platform 16 is implemented using data centers, other embodiments of the platform 16 are not limited to data centers and can utilize other types of remote network infrastructures. Moreover, other embodiments of the present disclosure may combine one or more different virtual servers into a single virtual server or, conversely, perform operations attributed to a single virtual server using multiple virtual servers. For instance, using FIG. 2 as an example, the virtual servers 26A, 26B, 26C, 26D and virtual database servers 104A, 104B may be combined into a single virtual server. Moreover, the present approaches may be implemented in other architectures or configurations, including, but not limited to, multi-tenant architectures, generalized client/server implementations, and/or even on a single physical processor-based device configured to perform some or all of the operations discussed herein. Similarly, though virtual servers or machines may be referenced to facilitate discussion of an implementation, physical servers may instead be employed as appropriate. The use and discussion of FIGS. 1 and 2 are only examples to facilitate ease of description and explanation and are not intended to limit the disclosure to the specific examples illustrated therein.

As may be appreciated, the respective architectures and frameworks discussed with respect to FIGS. 1 and 2 incorporate computing systems of various types (e.g., servers, workstations, client devices, laptops, tablet computers, cellular telephones, and so forth) throughout. For the sake of completeness, a brief, high level overview of components typically found in such systems is provided. As may be appreciated, the present overview is intended to merely provide a high-level, generalized view of components typical in such computing systems and should not be viewed as limiting in terms of components discussed or omitted from discussion.

Figure 3:
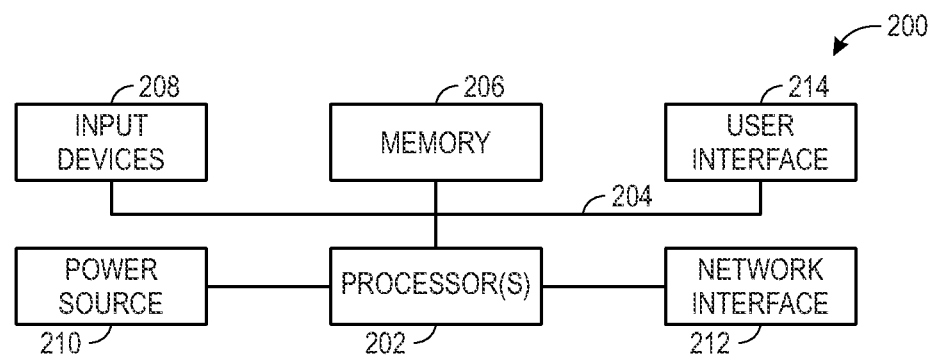
FIG. 3 is a block diagram of a computing device utilized in a computing system that may be present in FIG. 1 or 2, in accordance with aspects of the present disclosure.

By way of background, it may be appreciated that the present approach may be implemented using one or more processor-based systems such as shown in FIG. 3. Likewise, applications and/or databases utilized in the present approach may be stored, employed, and/or maintained on such processor-based systems. As may be appreciated, such systems as shown in FIG. 3 may be present in a distributed computing environment, a networked environment, or other multi-computer platform or architecture. Likewise, systems such as that shown in FIG. 3, may be used in supporting or communicating with one or more virtual environments or computational instances on which the present approach may be implemented.

With this in mind, an example computer system may include some or all of the computer components depicted in FIG. 3. FIG. 3 generally illustrates a block diagram of example components of a computing system 200 and their potential interconnections or communication paths, such as along one or more busses. As illustrated, the computing system 200 may include various hardware components such as, but not limited to, one or more processors 202, one or more busses 204, memory 206, input devices 208, a power source 210, a network interface 212, a user interface 214, and/or other computer components useful in performing the functions described herein.

The one or more processors 202 may include one or more microprocessors capable of performing instructions stored in the memory 206. In some embodiments, the instructions may be pipelined from execution stacks of each process in the memory 206 and stored in an instruction cache of the one or more processors 202 to be processed more quickly and efficiently. Additionally or alternatively, the one or more processors 202 may include application-specific integrated circuits (ASICs), field-programmable gate arrays (FPGAs), and/or other devices designed to perform some or all of the functions discussed herein without calling instructions from the memory 206.

With respect to other components, the one or more busses 204 include suitable electrical channels to provide data and/or power between the various components of the computing system 200. The memory 206 may include any tangible, non-transitory, and computer-readable storage media. Although shown as a single block in FIG. 1, the memory 206 can be implemented using multiple physical units of the same or different types in one or more physical locations. The input devices 208 correspond to structures to input data and/or commands to the one or more processors 202. For example, the input devices 208 may include a mouse, touchpad, touchscreen, keyboard and the like. The power source 210 can be any suitable source for power of the various components of the computing device 200, such as line power and/or a battery source. The network interface 212 includes one or more transceivers capable of communicating with other devices over one or more networks (e.g., a communication channel). The network interface 212 may provide a wired network interface or a wireless network interface. A user interface 214 may include a display that is configured to display text or images transferred to it from the one or more processors 202. In addition and/or alternative to the display, the user interface 214 may include other devices for interfacing with a user, such as lights (e.g., LEDs), speakers, and the like.

Figure 4:
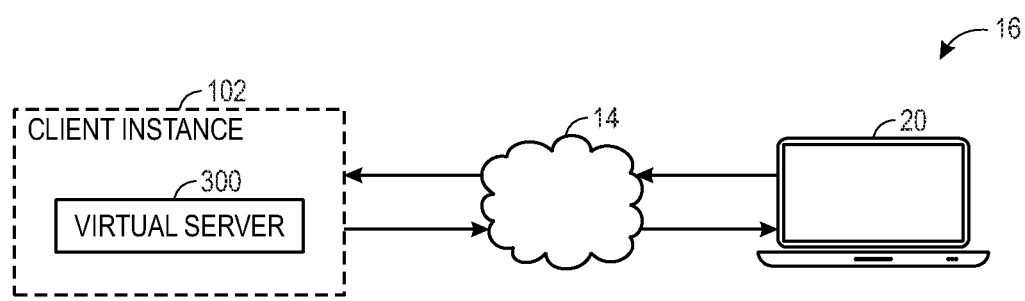
FIG. 4 is a block diagram illustrating an embodiment in which a virtual server supports and enables the client instance, in accordance with aspects of the present disclosure.

With the preceding in mind, FIG. 4 is a block diagram illustrating an embodiment in which a virtual server 300 supports and enables the client instance 102, according to one or more disclosed embodiments. More specifically, FIG. 4 illustrates an example of a portion of a service provider cloud infrastructure, including the cloud-based platform 16 discussed above. The cloud-based platform 16 is connected to a client device 20 via the network 14 to provide a user interface to network applications executing within the client instance 102 (e.g., via a web browser running on the client device 20). Client instance 102 is supported by virtual servers 26 similar to those explained with respect to FIG. 2, and is illustrated here to show support for the disclosed functionality described herein within the client instance 102. Cloud provider infrastructures are generally configured to support a plurality of end-user devices, such as client device(s) 20, concurrently, wherein each end-user device is in communication with the single client instance 102. Also, cloud provider infrastructures may be configured to support any number of client instances, such as client instance 102, concurrently, with each of the instances in communication with one or more end-user devices. As mentioned above, an end-user may also interface with client instance 102 using an application that is executed within a web browser.

With the preceding generalized context in mind, the presently disclosed approaches relate to using time series forecast steps to facilitate the prediction of automations to be performed on an IT resource (such as a cloud-based platform 16) at the request of a user or customer. In accordance with certain aspects of the present approaches, a sequence of time series dataset is obtained in a suitable data format (such as comma separated values (CSV) file or other suitable data file). The data may, if appropriate, be restructured so as to correspond to a supervised learning problem suitable for training a machine learning model or routine. This may be done, in one implementation, by using previous time steps as input variables and use the next time step as the output variable. The trained model or routine may be used in the prediction or forecasting of operations to be performed on the IT resource in question.

Figure 5:
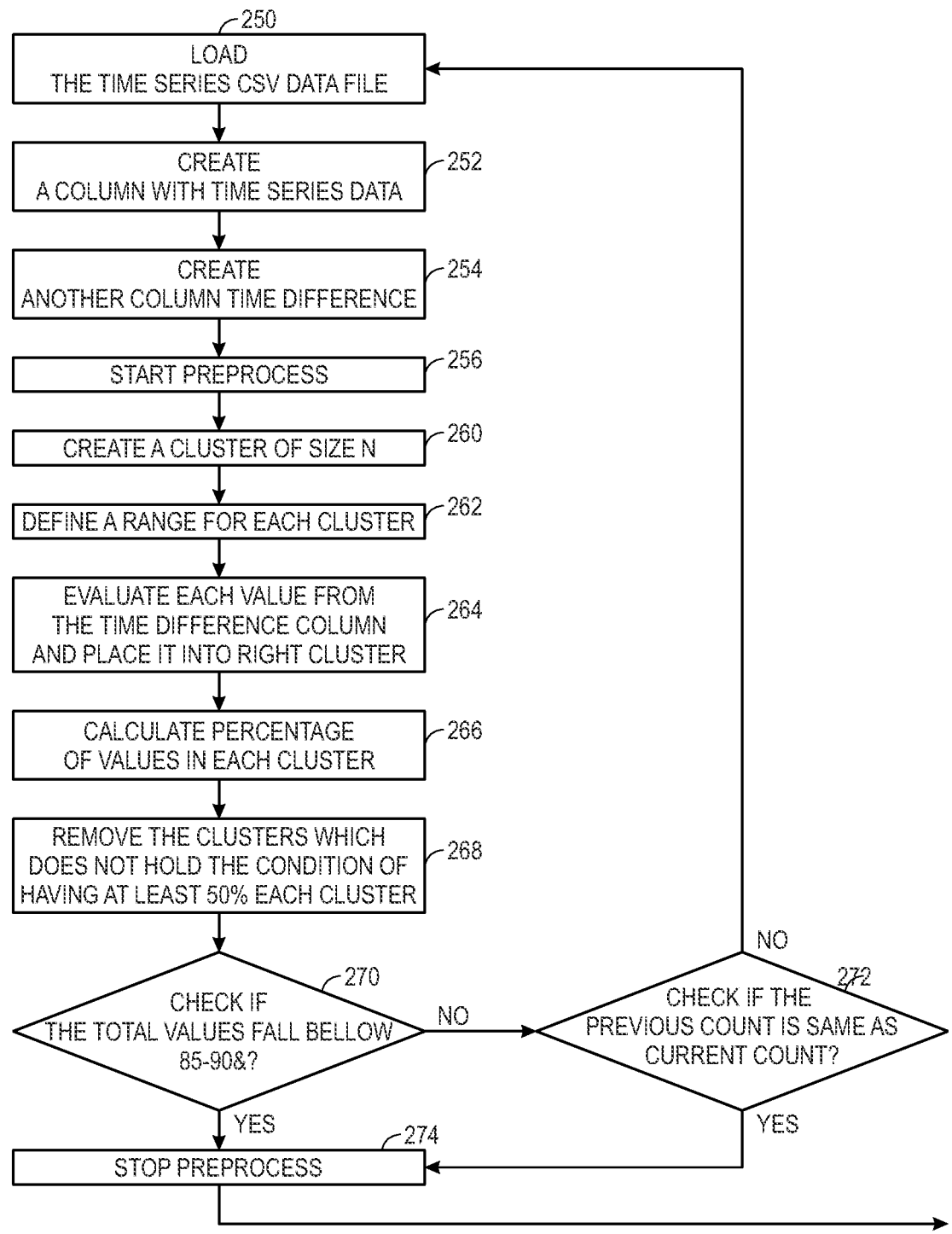
FIG. 5 depicts steps of an example process flow for pre-processing time series data, in accordance with aspects of the present disclosure.
Figure 6:
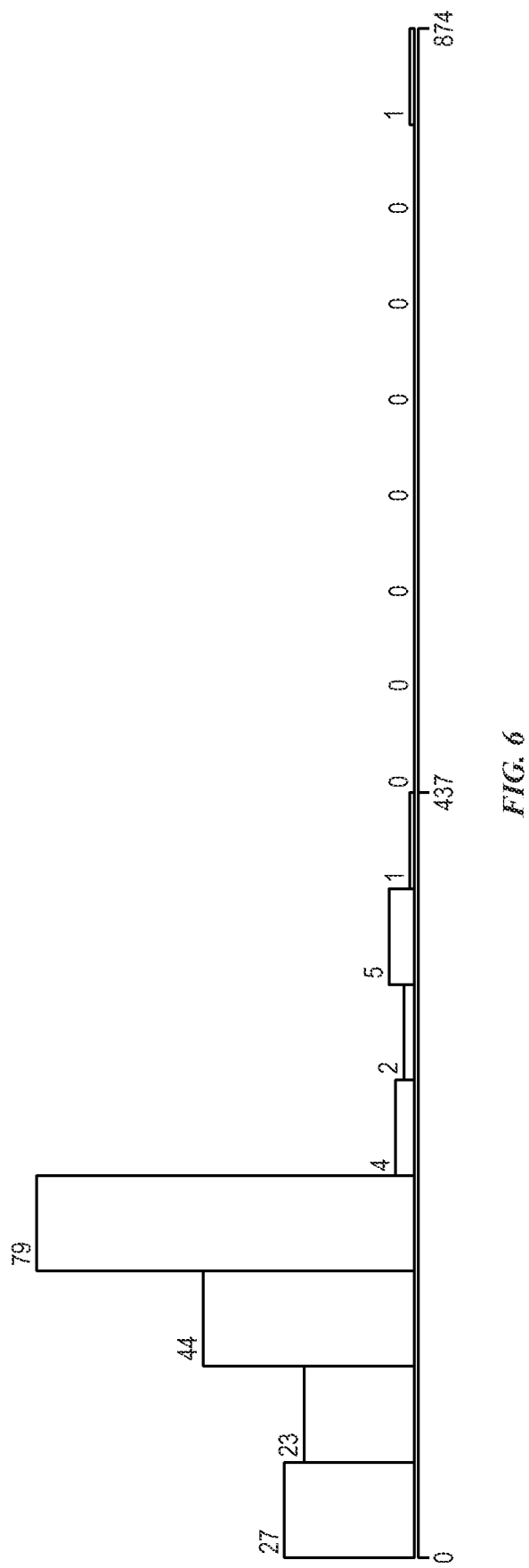
FIG. 6 depicts a graphical representation of time series data, in accordance with aspects of the present disclosure.

Turning to FIGS. 5 and 6, aspects of this approach are shown by way of process flows corresponding to one possible implementation. As may be appreciated, the steps described with respect to FIGS. 5 and 6 may be embodied as processor-executable code that may be stored in a suitable format on a computer readable media and executed by a processor of a suitable processor-based system to perform the steps and actions described below on the processor-based system. In these figures, FIG. 5 depicts steps related to acquiring a time series data set and pre-processing the time-series data set. Conversely, FIG. 6 depicts steps relates to the use of the pre-processed data set to train a machine learning model and use of the model in selecting a model for forecasting operations to be applied to an IT resource. It may be appreciated and understood that the described steps are for the purpose of illustrating one possible real world implementation so as to provide a useful example and meaningful context. However, variations to these steps (such as differences with respect to referenced file formats, cluster sizes, percentages and thresholds, machine learning tools, statistical techniques and tools, and so forth) should be understood as being contemplated and as being encompassed by the present teachings.

Turning to FIG. 5, aspects of acquiring and pre-processing a time series data set are illustrated. Such data pre-processing may be useful to outliers and extremis values from consideration in the subsequent machine learning training processes. In the depicted example, the process begins at step 250, where a time series data file (here depicted as being in CSV format) is acquired and loaded or input to the process. The time series data files comprises a series of time values (e.g., timestamps, which may include a value or values corresponding to a date and time) corresponding to observed dates and times when operations have been run on an instance(s) by a user or customer. In accordance with the depicted example, at step 252 the time series data is sorted into or otherwise used to populate a column of a table or other data structure. Time difference data is generated (e.g., the time difference between sequential observations (e.g., timestamps) in the time series data) and, in the present example, is used to populate another column of the table or data structure. For example, each time difference may be the value, in number of hours and/or number of days, between sequential events based on the timestamp associated with the events in the time series data. A graphical illustration of time difference data prepared in this manner is shown in FIG. 6, where the y-axis conveys counts of observations and the x-axis conveys time difference as measured in hours. Once the time difference data is generated, the pre-process process may be started (step 256).

In the pre-process steps, the clusters of classes are prepared and each input value is sorted into the proper cluster. Clusters with the least values (e.g., outliers or other extreme observations) are discarded from further processing (such as based upon a specified threshold cutoff). This process may be repeated or iterated until there are no further clusters to remove and/or until the number of total values falls below a specified threshold (e.g., 10% to 15%).

Figure 7:
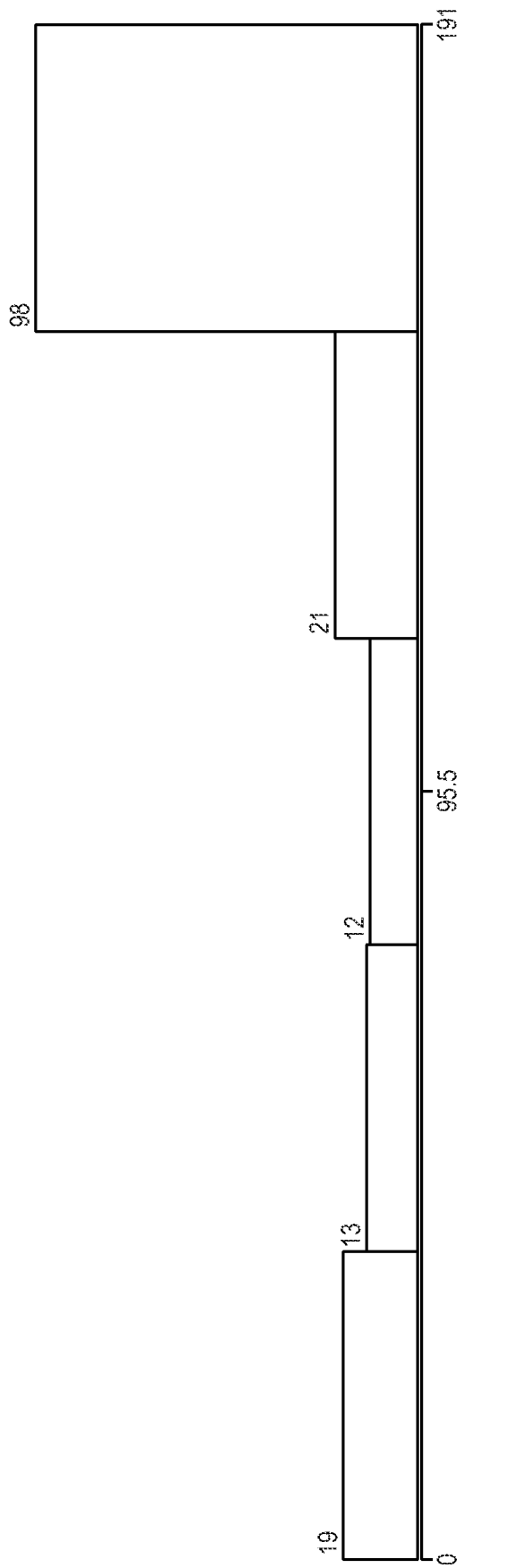
FIG. 7 depicts a graphical representation of time series data sorted into clusters, in accordance with aspects of the present disclosure.

Turning back to FIG. 5, an example of these steps as may be performed in one implementation is shown. In this example, clusters of size n are created (step 260 and a range is defined for each cluster (Step 262). Each time difference value is sorted into the proper cluster based on the defined range of each cluster at step 264. The percentage of the of time difference values that are in each cluster is calculated at step 266. Clusters having below a first threshold percentage of the time difference values are discarded at step 268 (i.e., those clusters having the least number of values are discarded). After clusters falling below the first threshold are discarded, a determination is made at step 270 whether the total number of time difference values has fallen below a second threshold, depicted as below 85% to 90% in the depicted example (i.e., has the total number of values fallen below 10% to 15% of the total). A graphical illustration of this clustering process is shown in FIG. 7, where the y-axis conveys counts of observations and the x-axis conveys time difference as measured in hours. If the determination is yes, pre-processing is stopped (step 274). If the determination is no, a check (step 272) is made as to whether the previous count is the same as the current count. If this determination is yes (i.e., no more values to be discarded), pre-processing is stopped. However, if this determination is no, the pre-processing steps are repeated starting at step 260 until it is determined stop condition for pre-processing is met.

Figure 8:
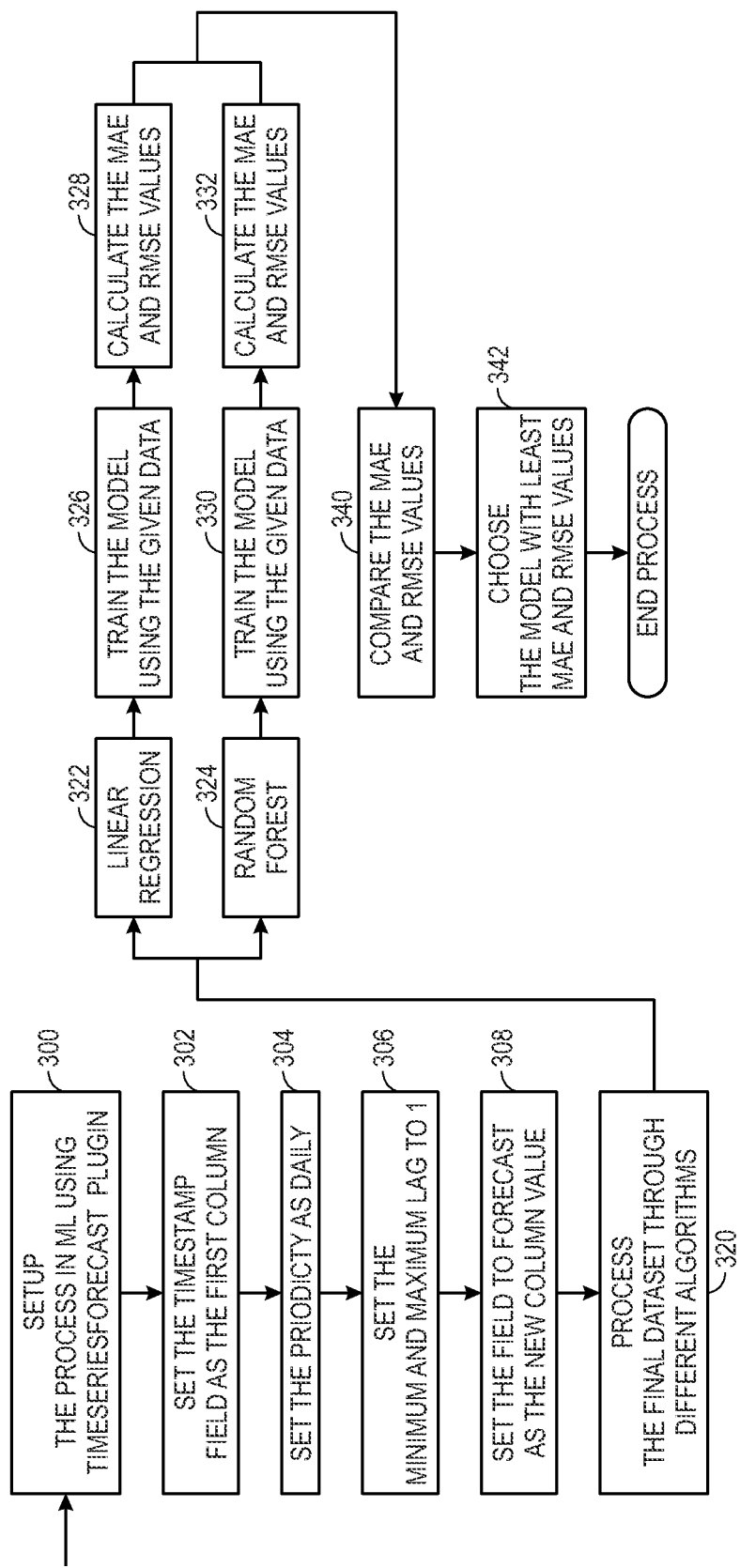
FIG. 8 depicts steps of an example process flow for processing time series data, in accordance with aspects of the present disclosure.

The output of the pre-processing steps shown in FIG. 5 is provided as an input to the processing steps illustrated in FIG. 8. In the depicted example, the pre-processed data is provided as an input and used to setup or configure one or more machine learning processes at step 300, such as using a suitable time series data plugin. One example of suitable machine learning processes or tools is WEKA® (Waikato Environment for Knowledge Analysis). In this example, using WEKA® as the context, the setup process may include setting up a timestamp field as a first column (step 302), setting the periodicity as daily (step 304), setting the minimum and maximum lag to 1 (step 306), and setting the field to forecast as the new column value (step 308).

Figure 9:
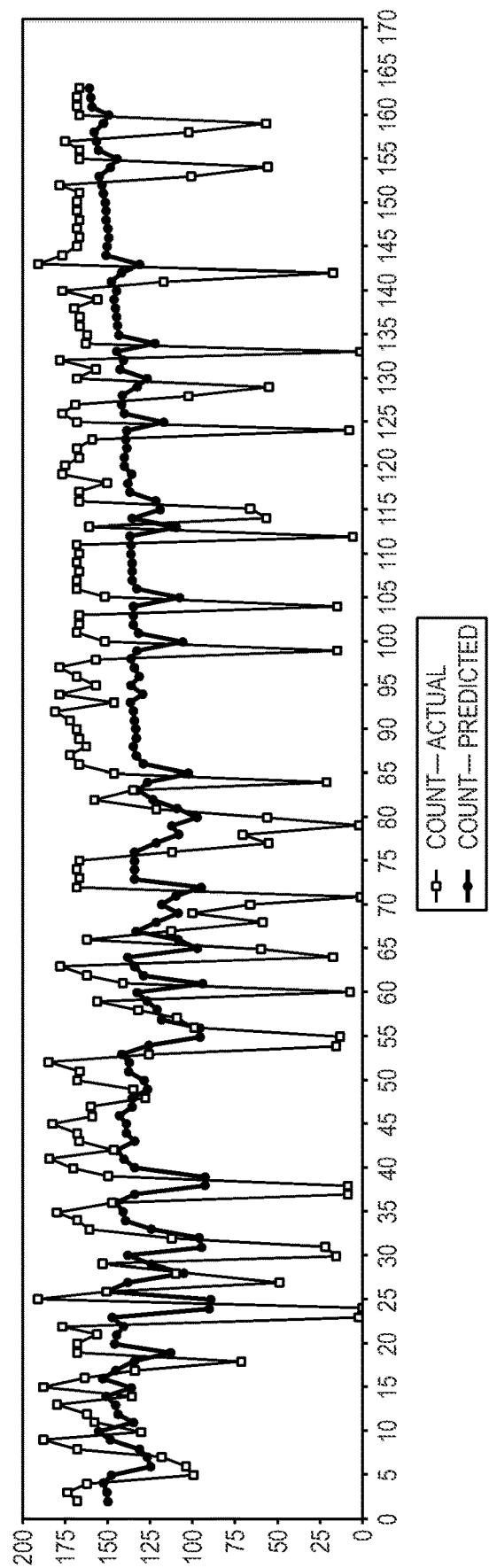
FIG. 9 depicts an output of a trained linear regression model, in accordance with aspects of the present disclosure.
Figure 10:
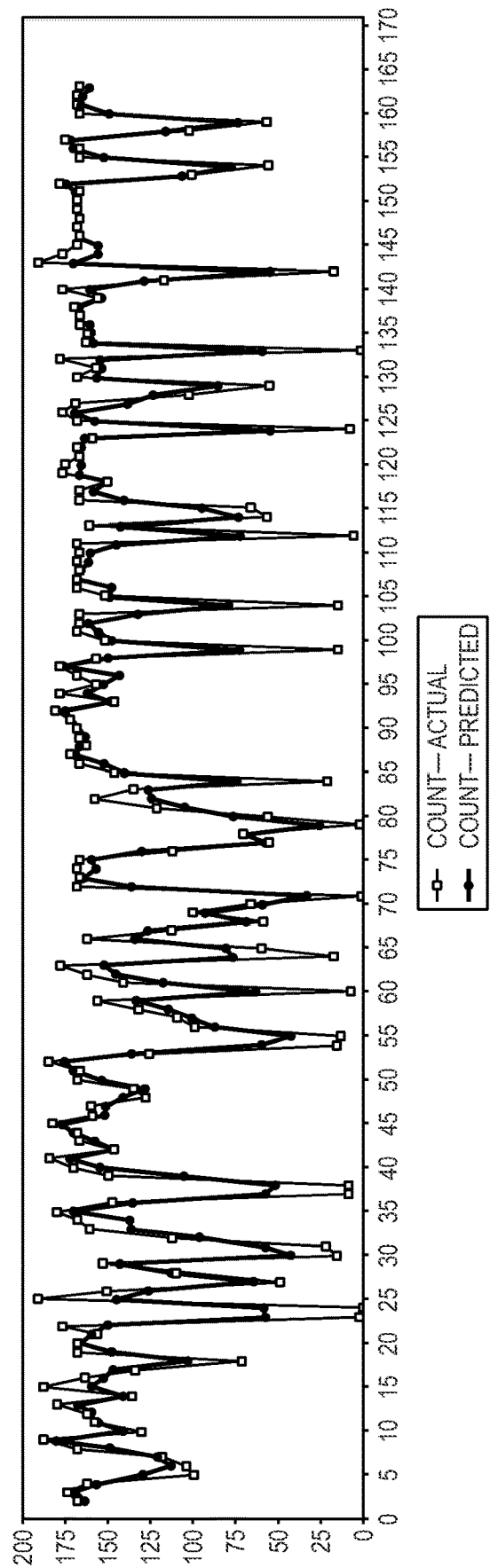
FIG. 10 depicts an output of a trained random forest model, in accordance with aspects of the present disclosure.

The final dataset may then be processed (step 320) through one or more supported time series analytic routines to select a model for predicting a next future value, such as the next incidence of a given operation being requested or scheduled to be run on an instance on a cloud platform. In the depicted example, linear regression (block 322) and random forest (block 324) machine learning analytics are executed on the final dataset. For the linear regression analysis, the model is trained (step 326) and, based upon the trained model, root mean squared error (RMSE) and mean absolute error (MAE) are calculated (step 328). An example of the output of such a linear regression analysis is shown in FIG. 9. Similarly, for the random forest analysis, the model is trained (step 330) and, based upon the trained model, root mean squared error (RMSE) and mean absolute error (MAE) are calculated (step 332). An example of the output of such a random forest analysis is shown in FIG. 10.

In the depicted example, the MAE and RMSE values for the models employed are compared (step 340). The model having the lowest (i.e., best) MAE and RMSE values is identified and selected (step 342) as being most suitable for predicting future occurrence (i.e., scheduling or request) of a given operation by a customer for their instance(s). While MAE and RMSE are described herein, any suitable measure of the fit of a model to an underlying dataset may be employed to select a suitable model. MAE and RMSE are merely two examples of such metrics. The process is then ended and the selected model may be used to predict future requests for a given operation or automation on a respective instance, allowing scheduling and resource allocation to be managed accordingly.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

The invention claimed is:

1. A processor-implemented method for predicting an occurrence of an information technology (IT) operation, comprising:
   receiving time series data associated with one or more types of operations performed on an information technology (IT) platform;
   determining a plurality of time difference values for the time series data, wherein each time difference value of the plurality of time difference values comprises a respective time period between different sequential operations performed on the IT platform;
   pre-processing the time series data to remove one or more outlier time difference values from the plurality of time difference values to derive a pre-processed dataset;
   configuring one or more time series analytic routines based on the pre-processed dataset to specify a final dataset;
   generating respective models based on the final dataset using the one or more time series analytic routines;
   predicting a request for an operation to be performed at a particular time on the IT platform based on the respective models; and
   scheduling the operation to be performed at the particular time based on the predicted request.

2. The processor-implemented method of claim 1, comprising:
   before scheduling the operation to performed at the particular time:
      determining whether the operation being performed at the particular time is mutually exclusive with respect to a second operation scheduled to be performed on the IT platform, wherein an execution time associated with the operation at the particular time would overlap with a second execution time associated with the second operation; and
      scheduling the operation to be performed at the particular time in response to determining that the operation is mutually exclusive with respect to the second operation.

3. The processor-implemented method of claim 1, wherein pre-processing the time series data to remove the one or more outlier time difference values comprises repeatedly pre-processing the time series data until a total number of time difference values falls below a threshold value.

4. The processor-implemented method of claim 1, comprising calculating one or more measures of respective fits of each model of the respective models.

5. The processor-implemented method of claim 4, wherein predicting the request for the operation to be performed on the IT platform based on the respective models comprises selecting a particular model of the respective models for predicting the request for the operation based on the one or more measures of the respective fits of each model of the respective models.

6. The processor-implemented method of claim 1, wherein the one or more time series analytic routines comprise a linear regression analytic routine, a random forest analytic routine, or both.

7. The processor-implemented method of claim 1, wherein the one or more time series analytic routines comprise machine learning routines.

8. A non-transitory, computer-readable medium, comprising instructions that when executed by one or more processors, cause the one or more processors to perform operations comprising:
    receiving time series data associated with one or more types of operations performed on an information technology (IT) platform;
    determining a plurality of time difference values for the time series data, wherein each time difference value of the plurality of time difference values comprises a respective time period between different sequential operations performed on the IT platform;
    pre-processing the time series data to remove one or more outlier time difference values from the plurality of time difference values to derive a pre-processed dataset;
    configuring one or more time series analytic routines based on the pre-processed dataset to specify a final dataset;
    generating respective models based on the final dataset using the one or more time series analytic routines;
    predicting a request for an operation to be performed at a particular time on the IT platform based on the respective models; and
    scheduling the operation to be performed at the particular time based on the predicted request.

9. The non-transitory, computer-readable medium of claim 8, wherein the operations comprise executing the operation at the particular time.

10. The non-transitory, computer-readable medium of claim 8, wherein pre-processing the time series data to remove the one or more outlier time difference values comprises repeatedly pre-processing the time series data until a total number of time difference values falls below a threshold value.

11. The non-transitory, computer-readable medium of claim 8, wherein the time series data comprises a plurality of timestamps for the one or more types of operations.

12. The non-transitory, computer-readable medium of claim 8, wherein the one or more time series analytic routines comprise machine learning routines.

13. The non-transitory, computer-readable medium of claim 8, wherein the one or more time series analytic routines comprise a linear regression analytic routine, a random forest analytic routine, or both.

14. A system, comprising:
    a processor; and
    a memory, accessible by the processor, the memory storing instructions, that when executed by the processor, cause the processor to perform operations comprising:
        receiving time series data associated with one or more types of operations performed on an information technology (IT) platform;
        determining a plurality of time difference values for the time series data, wherein each time difference value of the plurality of time difference values comprises a respective time period between different sequential operations performed on the IT platform;
        pre-processing the time series data to remove one or more outlier time difference values from the plurality of time difference values to derive a pre-processed dataset;
        configuring one or more time series analytic routines based on the pre-processed dataset to specify a final dataset;
        generating respective models based on the final dataset using the one or more time series analytic routines;
        predicting a request for an operation to be performed at a particular time on the IT platform based on the respective models; and
        scheduling the operation to be performed at the particular time based on the predicted request.

15. The system of claim 14, wherein the operations comprise:
    before scheduling the operation to performed at the particular time:
        determining whether an execution time associated with the operation being performed at the particular time would overlap with a second execution time associated with a second operation scheduled to be performed on the IT platform; and
        scheduling the operation to be performed at the particular time in response to determining that the execution time associated with the operation would not overlap with the second execution time associated with the second operation.

16. The system of claim 14, wherein pre-processing the time series data to remove the one or more outlier time difference values comprises repeatedly pre-processing the time series data until a total number of time difference values falls below a threshold value.

17. The system of claim 14, wherein pre-processing the time series data to remove the one or more outlier time difference values comprises:
    in an iterative loop:
        characterizing a set of clusters;
        sorting the plurality of time difference values into respective clusters of the set of clusters;
        processing the set of clusters to remove one or more clusters containing the one or more outlier time difference values; and
        exiting the iterative loop when no further clusters are determined to be removeable.

18. The system of claim 17, wherein characterizing the set of clusters comprises specifying a number of clusters and a range of each cluster.

19. The system of claim 17, wherein processing the set of clusters to remove the one or more clusters comprises evaluating each cluster of the set of clusters based on a discard threshold value.

20. The system of claim 14, wherein the time series data comprises a plurality of timestamps for the one or more types of operations.

* * * * *